(12) United States Patent
Meyer, IV et al.

(10) Patent No.: US 7,875,900 B2
(45) Date of Patent: Jan. 25, 2011

(54) THERMALLY CONDUCTIVE STRUCTURE OF LED AND MANUFACTURING METHOD THEREOF

(75) Inventors: George Anthony Meyer, IV, San Jose, CA (US); Chien-Hung Sun, Zhongli (TW); Chieh-Ping Chen, Zhongli (TW)

(73) Assignee: Celsia Technologies Taiwan, Inc., Taoyuan (TW)

( * ) Notice: Subject to any disclaimer, the term of this patent is extended or adjusted under 35 U.S.C. 154(b) by 37 days.

(21) Appl. No.: 12/325,554

(22) Filed: Dec. 1, 2008

(65) Prior Publication Data
US 2010/0133553 A1    Jun. 3, 2010

(51) Int. Cl.
*H01L 33/00* (2010.01)
(52) U.S. Cl. .......... 257/99; 257/E33.056; 257/E33.058; 257/E33.062; 257/E33.066
(58) Field of Classification Search ............... 257/99, 257/E33.056, E33.058, E33.062, E33.066
See application file for complete search history.

(56) References Cited

U.S. PATENT DOCUMENTS

| 4,169,018 A * | 9/1979 | Berdan et al. ............... 205/50 |
| 2008/0170367 A1* | 7/2008 | Lai ............................. 361/700 |

* cited by examiner

*Primary Examiner*—Victor Mandala
(74) *Attorney, Agent, or Firm*—Chun-Ming Shih; HDLS IPR Services

(57) ABSTRACT

A thermally conductive structure of a light emitting diode (LED) includes a vapor chamber, an insulating layer, an electrically conductive layer and a plurality of LEDs. In the invention, the insulating layer is plated over a surface of the vapor chamber; the electrically conductive layer disposed on the insulating layer is electrically separated from the vapor chamber and has a first electrode and a second electrode; and the LEDs arranged on the insulating layer respectively have a first leg connected to the first electrode and a second leg connected to the second electrode; thereby, the invention has an excellent performance of thermal conduction and heat dissipation, which is capable of prolonging the lifespan of LED.

10 Claims, 5 Drawing Sheets

THERMALLY CONDUCTIVE STRUCTURE OF LED AND MANUFACTURING METHOD THEREOF

BACKGROUND OF THE INVENTION

1. Field of the Invention

The present invention in general relates to a thermally conductive structure and a manufacturing method thereof, in particular, to a thermally conductive structure of a light emitting diode (LED) and a manufacturing method thereof.

2. Description of Prior Art

Following technology's continuous development and progress, electronic elements have being developed toward a trend of small size and lightweight. Taking LED as example, since of many merits such as superior illumination, longer lifespan, more power conservation and environmental friendliness, LED has being comprehensively applied by the industries in the fields of electronic devices. However, the most notable factor influencing the lifespan of LED is a working atmosphere of appropriate temperature, under which the LEDs can be operated with an optimal performance. Accordingly, the inventor takes LED's cooling as a studying issue for the present case.

A thermally conductive structure of LED according to the prior art mainly includes a substrate, an insulating layer, an electrically conductive layer and a plurality of LEDs. The insulating layer is formed on a surface of the substrate. The electrically conductive layer that is formed on the insulating layer is electrically separated from the substrate and has a first electrode and a second electrode. The plural LEDs arranged on the insulating layer respectively have a first leg electrically connected to the first electrode and a second leg electrically connected to the second electrode. Thereby, a thermally conductive structure of LED is thus constituted.

When this thermally conductive structure of LED is being used, electricity passes through the first and second electrodes of the LEDs. Then, the LEDs generate light and heat, from which the light is irradiated, while the heat is conducted to the substrate via the insulating layer. Finally, the substrate dissipates the all heat generated from the LEDs.

However, in terms of practical application, the thermally conductive structure of LED according to prior arts still has several shortcomings needed to be solved. Most importantly, since the thermally conductive speed of the substrate is too slow to reach an effective cooling, the cooling performance of the LED is thus influenced, further lowering the lifespan of the LED.

After a substantially devoted study, in cooperation with the application of relatively academic principles, the inventor has finally proposed the present invention that is designed reasonably to possess the capability to improve the prior arts significantly.

SUMMARY OF THE INVENTION

The invention is mainly to provide a thermally conductive structure of LED and a manufacturing method thereof. Through a vapor chamber quickly dissipating the heat generated by the LED, an excellent performance of thermal conduction is thus obtained, and thereby the lifespan of the LED is thus prolonged.

Secondly, the invention is to provide a thermally conductive structure of LED, which is constituted by a vapor chamber, an insulating layer, an electrically conductive layer and a plurality of LEDs. In the invention, the insulating layer is plated over a surface of the vapor chamber; the electrically conductive layer disposed on the insulating layer is electrically separated from the vapor chamber and has a first electrode and a second electrode; the LEDs arranged on the insulating layer respectively have a first leg connected to the first electrode and a second leg connected to the second electrode Thirdly, the invention also provides a manufacturing method of thermally conductive structure of LED, including the following steps: providing a vapor chamber; forming an insulating layer on a surface of the vapor chamber; forming an electrically conductive layer on the insulting layer, and electrically separating the electrically conductive layer from the vapor chamber, in which the electrically conductive layer has a first electrode and a second electrode; and arranging a plurality of LEDs on the insulating layer, in which the LEDs respectively have a first leg electrically connected to the first electrode and a second leg electrically connected to the second electrode.

Finally, the invention is to provide a thermally conductive structure of LED and a manufacturing method thereof, in which a cooling fin set attached by adhering onto the vapor chamber is capable of quickly dissipating the heat generated by the LED, thereby, possessing an excellent performance of heat dissipation to prolong the lifespan of LED.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE INVENTION

In cooperation with attached drawings, the technical contents and detailed description of the present invention are described thereinafter according to a number of preferable embodiments, not used to limit its executing scope. Any equivalent variation and modification made according to appended claims is all covered by the claims claimed by the present invention.

Figure 1:
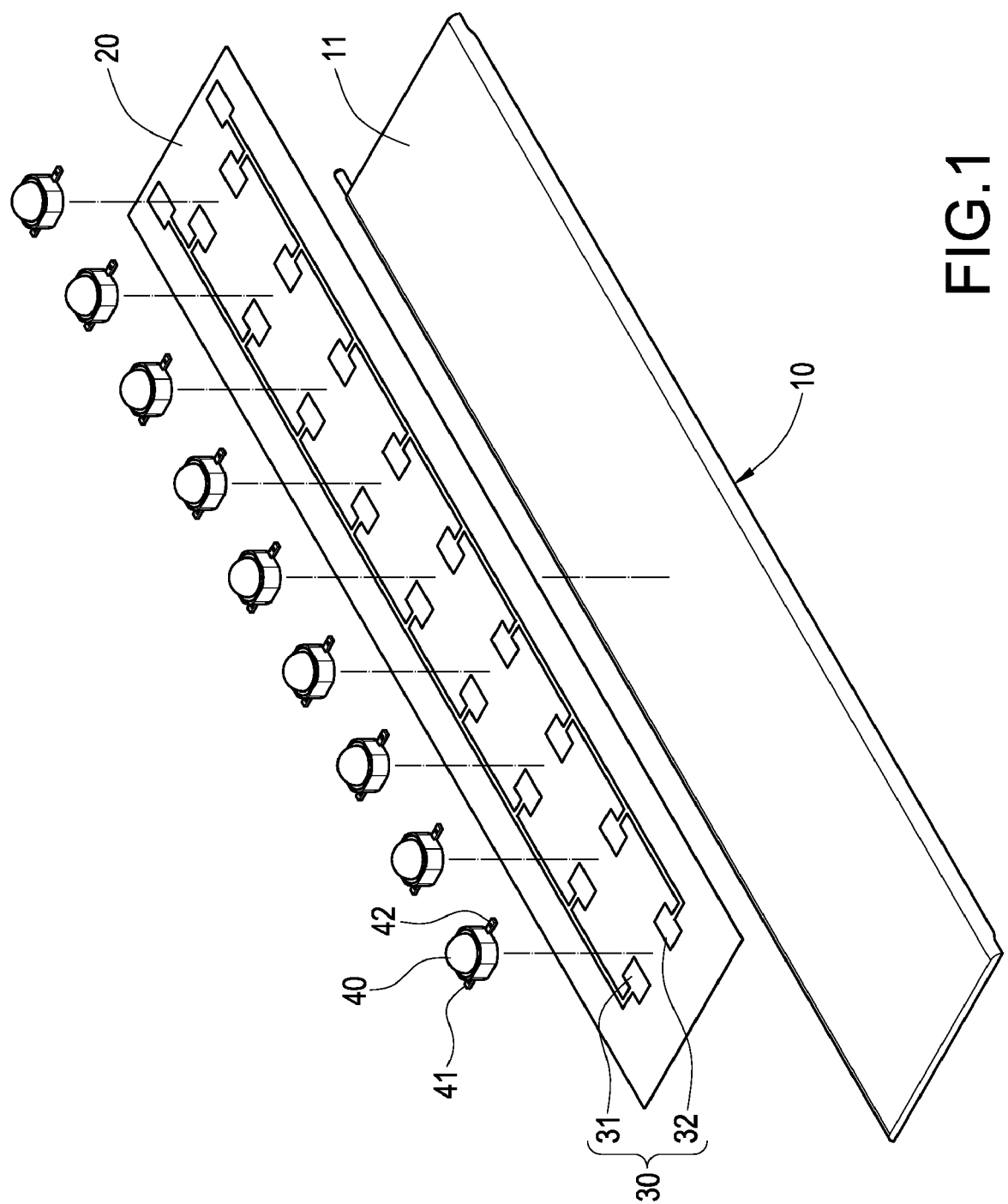
FIG. 1 is a perspective explosive illustration of the invention.
Figure 2:
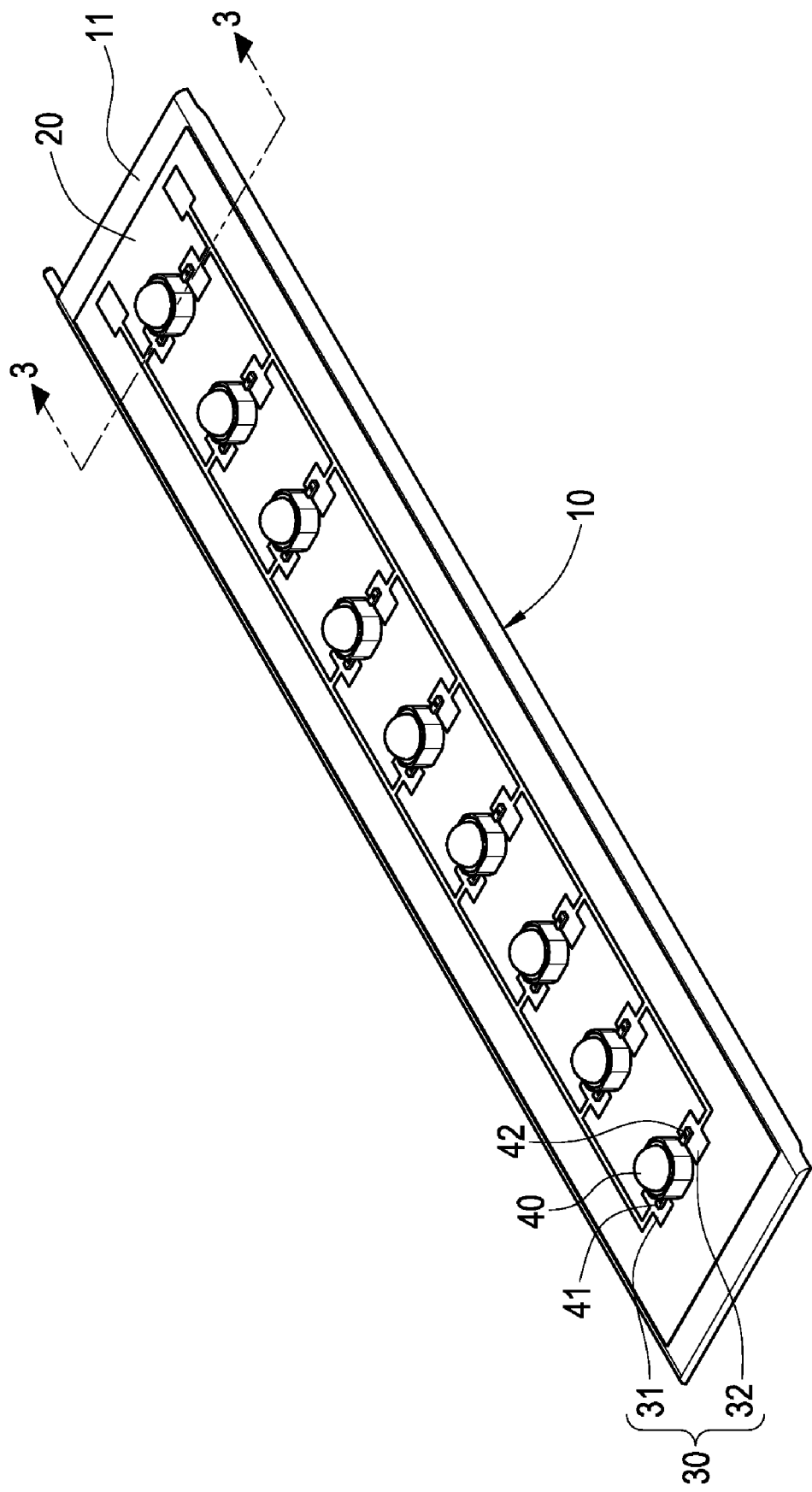
FIG. 2 is a perspective assembled illustration of the invention.
Figure 3:
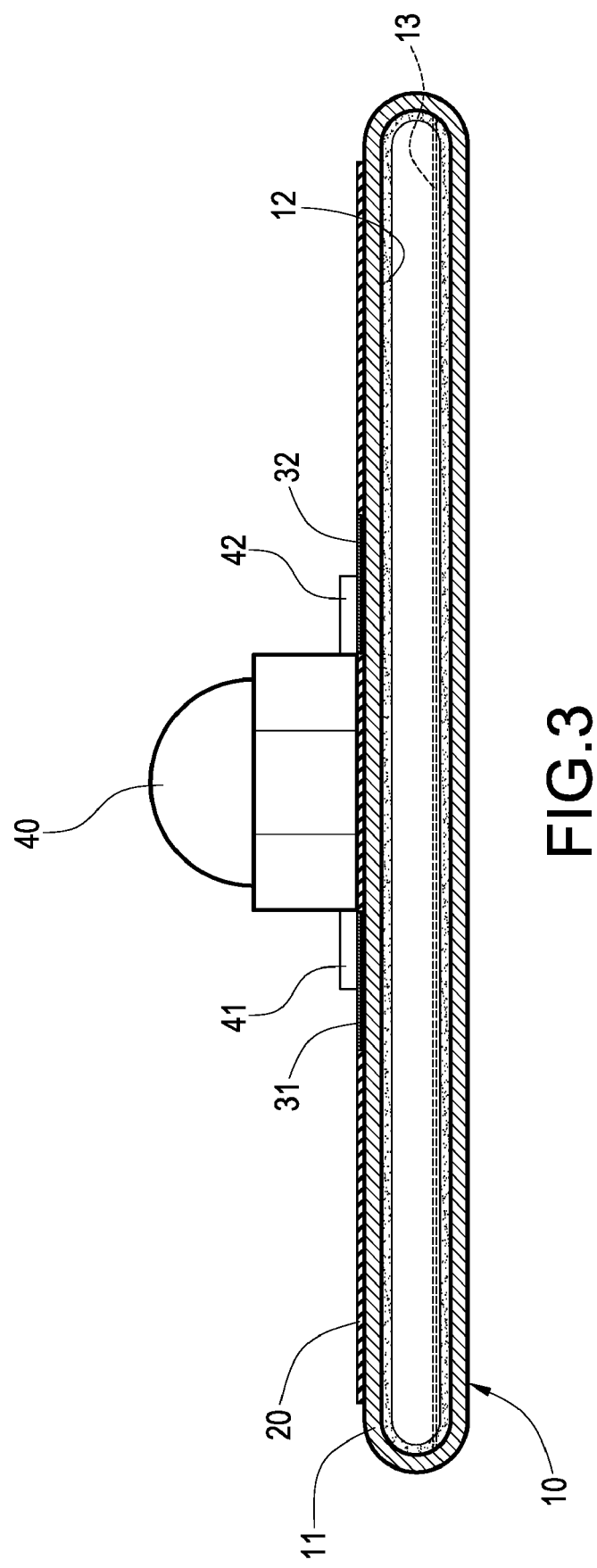
FIG. 3 is an illustration of "3-3" section in FIG. 2.

Please refer to FIG. 1 through FIG. 3, showing that a thermally conductive structure of LED of the invention is constituted by a vapor chamber 10, an insulating layer 20, an electrically conductive layer 30 and a plurality of LEDs 40.

The vapor chamber 10 has a shell 11, a capillary tissue 12 attached by adhering onto an interior of the shell 11 and a working fluid 13 filled in the shell 11 by injection. In addition, the vapor chamber 10 further arranges a supporter (not shown in the figures) accommodated in the shell 11 for enhancing the strength of the shell 11.

The insulating layer 20 is plated over a surface of the vapor chamber 10, in which the insulating layer 20 can be printed on the shell 11 of the vapor chamber 10 by means of a screen-printing technology or coated on the shell 11 of the vapor chamber 10 by means of an adhesive-coating technology. However, they are not the only technologies can be used herein. The insulating layer 20 can be made of materials such as a thermally conductive silica gel or an epoxy resin, which all can provide an excellent performance of thermal conduction.

The electrically conductive layer 30 is disposed on the insulating layer 20. Preferably, the electrically conductive layer 30 is disposed on the insulating layer by means of a high pressure sealing manner and is electrically separated from the vapor chamber 10. In this case, the electrically conductive layer 30 has a first electrode 31 and a second electrode 32. The first electrode 31 and the second electrode 32 are not electrically connected to each other. The electrically conductive layer 30 can be a copper foil circuit board or an aluminum foil circuit board. The first electrode 31 and the second electrode 32 can respectively be an anode and cathode, or a cathode and anode.

The LEDs 40 are arranged on the insulating layer 20 and respectively have a first leg 41 electrically connected to the first electrode 31 and a second leg 42 electrically connected to the second electrode 32. The first leg 41 and the second leg 42 are respectively connected to the first electrode 31 and the second electrode 32 by means of a welding manner or can be fastened by means of a SMT (surface mount technology), but they are not the only technologies can be used herein.

Please refer to FIG. 3, when the invention is being used, the LEDs 40 are electrified via the first and second electrodes 31, 32, and the LEDs 40 instantly generates light and heat, from which the light is irradiated, while the heat is conducted to the vapor chamber 10 via the insulating layer 20. Through the vapor chamber 10, the heat generated from the LEDs 40 is quickly conducted away. Thereby, an excellent performance of thermal conduction is obtained and the lifespan of LEDs is prolonged.

Figure 4:
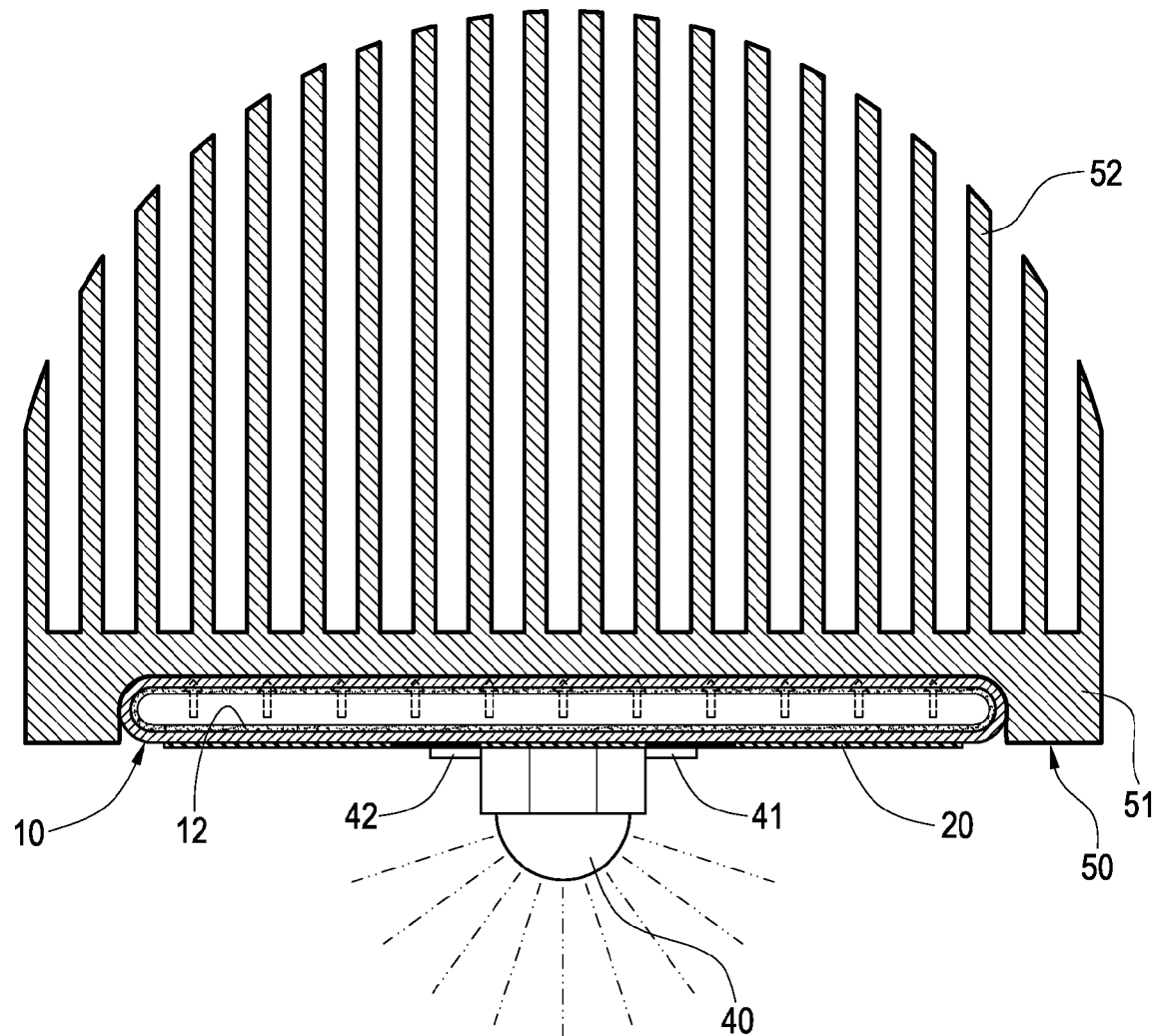
FIG. 4 is an illustration showing another preferable embodiment of the invention.

Please refer to FIG. 4, showing another embodiment of the invention. The difference between this embodiment and last one is that the invention can further include a cooling fin set 50 thermally connected to another surface of the vapor chamber 10. The cooling fin set 50 is constituted by a side surface 51 and a plurality of cooling fins 52 extended from the side surface 51. The vapor chamber 10 is arranged by adhering onto the side surface 51, such that the cooling fin set 50 can more quickly dissipate the heat generated from the LEDs 40. Thereby, an excellent performance of thermal conduction and heat dissipation is thus obtained and the lifespan of the LED is prolonged as well.

Figure 5:
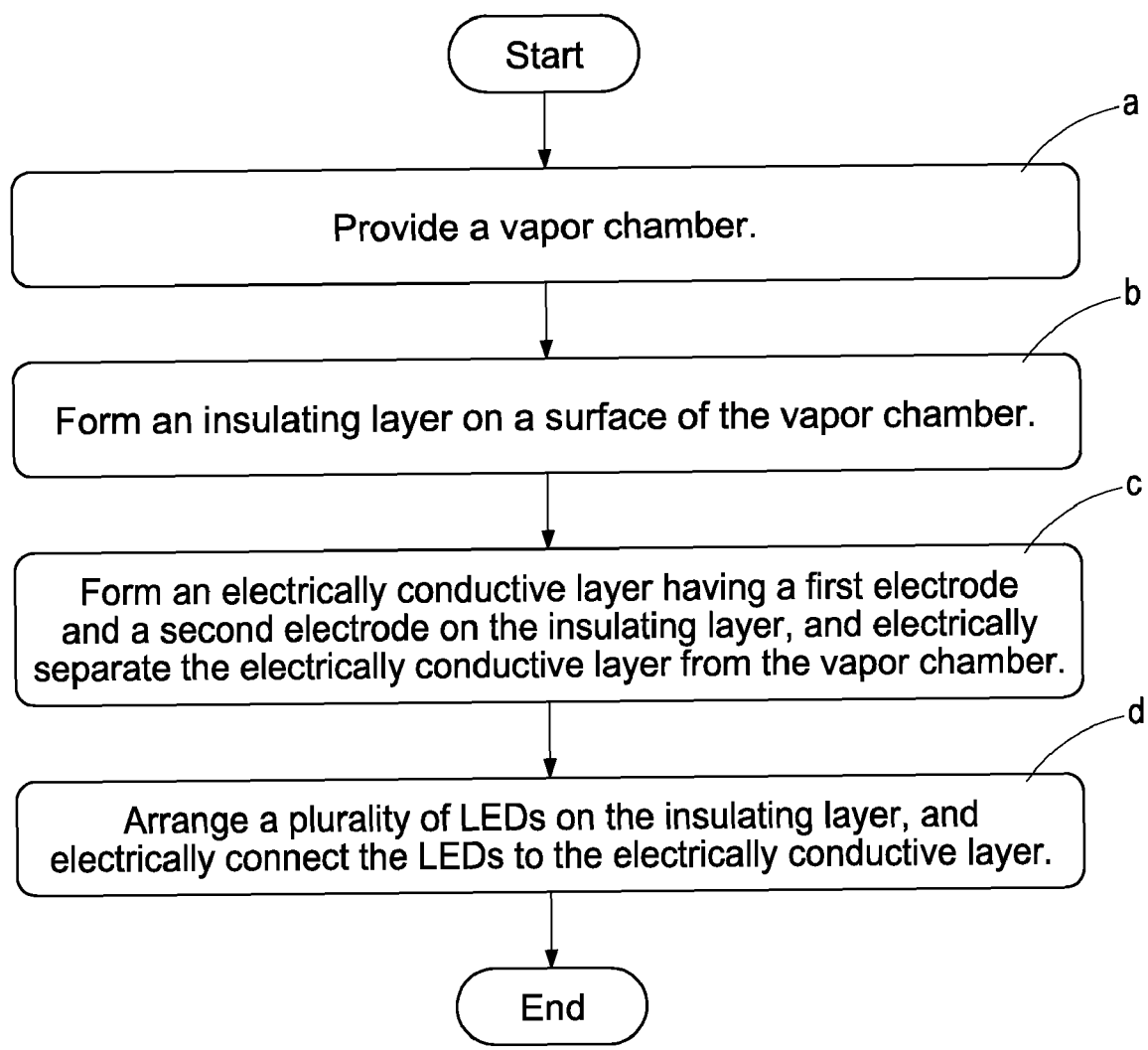
FIG. 5 is a step flowchart of the invention.

Please refer to FIG. 5. The manufacturing method of thermally conductive structure of LED according to the present invention includes the following steps.

a) Providing a vapor chamber 10;

b) Forming an insulating layer 20 on a surface of the vapor chamber 10;

c) Forming an electrically conductive layer 30 on the insulting layer 20 and electrically separating the electrically conductive layer from the vapor chamber, in which the electrically conductive layer 30 has a first electrode 31 and a second electrode 32, which are formed on the insulating layer 20 and are non-electrically connected to each other; and d) Arranging a plurality of LEDs 40 on the insulating layer 30, and electrically connecting the LEDS 40 to the electrically conductive layer 30, in which the LEDs 40 respectively have a first leg 41 electrically connected to the first electrode 31 and a second leg 42 electrically connected to the second electrode 32.

In step b, the insulating layer 30 can be printed on the surface of the vapor chamber 10 by means of a screen-printing technology or coated on the surface of the vapor chamber 10 by means of an adhesive-coating technology. In step c, the electrically conductive layer 30 can be disposed on the insulating layer 20 by means of a high pressure sealing manner or formed on the insulating layer 20 by means of a plating manner. In step d, the LEDs 40 can be separately fastened to the electrically conductive layer 30 by means of a surface mount technology (SMT). At last, after step d, a cooling fin set 50 may be arranged by adhering onto another surface of the vapor chamber 10. Therefore, through a thermally conductive structure of LED completed by the present method, the heat generated from the LEDs 40 can be dissipated quickly, thus that an excellent performance of thermal conduction and heat dissipation can be obtained and the lifespan of the LEDs 40 can be thereby prolonged as well.

Summarizing aforementioned description, because applying the invention can quickly conduct or dissipate the heat generated by the LEDs 40, an excellent performance of thermal conduction and heat dissipation can be obtained and the lifespan of LEDs 40 can be prolonged as well. In addition, since of a provision to solve each shortcoming of the prior art, the invention indeed possesses a high value of industrial application.

What is claimed is:

1. A thermally conductive structure of a light emitting diode (LED), including:

a vapor chamber;

an insulating layer, which is plated over a surface of the vapor chamber;

an electrically conductive layer, which is disposed on the insulating layer and is electrically separated from the vapor chamber, and which has a first electrode and a second electrode; and a plurality of LEDs, which are arranged in direct contact with the insulating layer and separately have a first leg connected to the first electrode and a second leg connected to the second electrode.

2. The thermally conductive structure of LED according to claim 1, wherein the vapor chamber includes a shell provided for the insulating layer to be plated thereon, a capillary tissue attached to an interior of the shell by adhesion and a working fluid filled in the interior of the shell.

3. The thermally conductive structure of LED according to claim 1, wherein the insulating layer is constituted by an epoxy resin.

4. The thermally conductive structure of LED according to claim 1, wherein the electrically conductive layer is a copper foil circuit.

5. The thermally conductive structure of LED according to claim 1, wherein the electrically conductive layer is disposed on the insulating layer by a high pressure sealing manner.

6. The thermally conductive structure of LED according to claim 1, further comprising a cooling fin set connected to another surface of the vapor chamber, wherein the cooling fin set further comprises a side surface and a plurality of cooling fins extending from the side surface.

7. The thermally conductive structure of LED according to claim 1, wherein the first leg and the second leg are respectively connected to the first electrode and the second electrode by a welding manner.

8. The thermally conductive structure of LED according to claim 1, wherein the first leg and the second leg are respectively fastened to the first electrode and the second electrode by a SMT (surface mount technology).

9. The thermally conductive structure of LED according to claim 1, wherein the insulating layer is printed on the surface of the vapor chamber by a screen-printing technology.

10. The thermally conductive structure of LED according to claim 1, wherein the insulating layer is coated over the surface of the vapor chamber by an adhesive-coating technology.

* * * * *